United States Patent [19]
Riordan

[11] Patent Number: 5,184,349
[45] Date of Patent: Feb. 2, 1993

[54] AMPLITUDE CONTROL OF A BURST SIGNAL IN A RECEIVER

[75] Inventor: Kenneth B. Riordan, Wauconda, Ill.

[73] Assignee: Motorola, Inc., Schaumburg, Ill.

[21] Appl. No.: 933,611

[22] Filed: Aug. 21, 1992

Related U.S. Application Data

[63] Continuation of Ser. No. 642,253, Jan. 16, 1991, abandoned.

[51] Int. Cl.$^5$ .............................................. H04B 7/212
[52] U.S. Cl. ..................................... 370/95.3; 375/98;
455/136; 455/138; 455/234.1; 455/249.1;
455/250.1; 455/251.1
[58] Field of Search ......................... 370/95.3; 375/98;
455/136, 138, 234.1, 249.1, 250.1, 251.1

[56] References Cited

U.S. PATENT DOCUMENTS

| | | | |
|---|---|---|---|
| 4,013,964 | 3/1977 | Skutta | 455/245.2 |
| 4,115,741 | 9/1978 | Skutta | 330/284 |
| 4,499,586 | 2/1985 | Cafarella et al. | 375/98 |
| 4,606,075 | 8/1986 | Eastmond | 455/234.2 |
| 4,757,502 | 7/1988 | Meuriche et al. | 370/104 |
| 4,768,204 | 8/1988 | Zeiss | 375/12 |
| 5,050,192 | 9/1991 | Nawata | 375/98 |

OTHER PUBLICATIONS

Dettro et al., "AGC Isolation of Information in TDMA Systems" PCT Application, International Publication Number WO90/06641 Filed Nov. 13, 1989.

*Primary Examiner*—Douglas W. Olms
*Assistant Examiner*—Russell W. Blum
*Attorney, Agent, or Firm*—Richard A. Sonnentag; Raymond J. Warren; John A. Fisher

[57] ABSTRACT

A receiver module 140 controls the amplitude of a random burst signal 200 in a TDMA system. A random burst signal 200 presence detector 330 detects when the random burst signal 200 has arrived during a timeslot reserved for the random access burst 200. After detection, a control processor monitors the signal strength or amplitude of the random access burst 200 for a predetermined time period, determines the amount of AGC attenuation required, and inserts the required AGC attenuation to control the amplitude of the random access burst 200 for the duration of the timeslot.

20 Claims, 3 Drawing Sheets

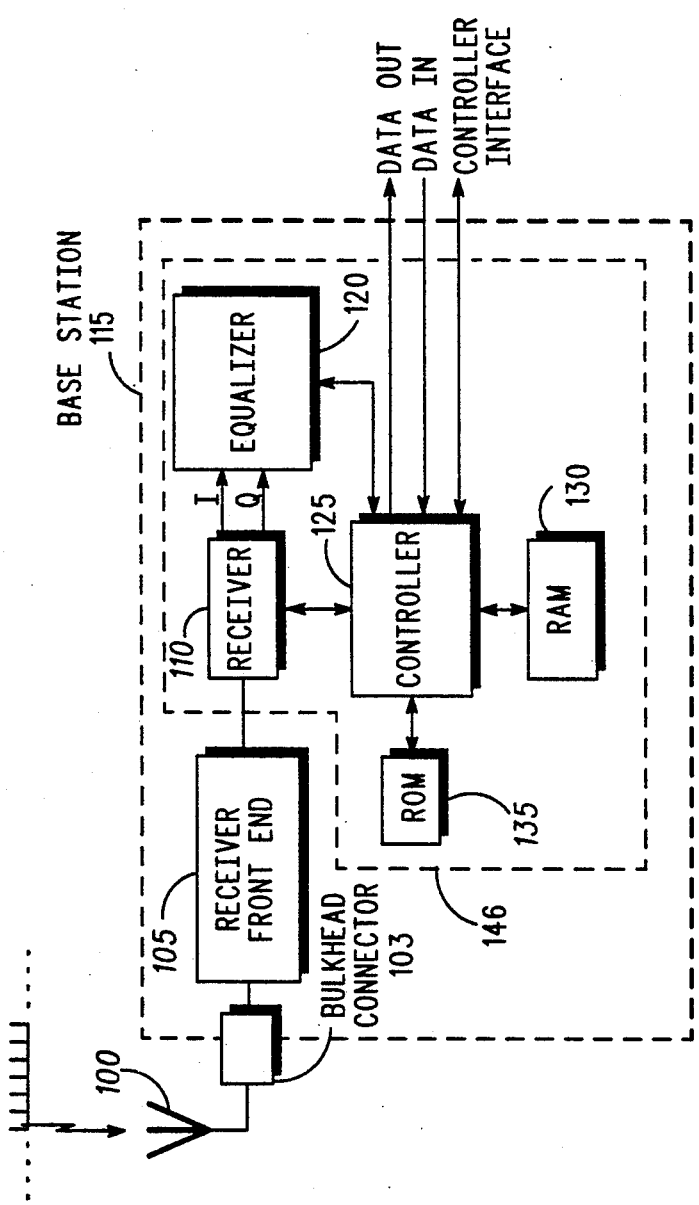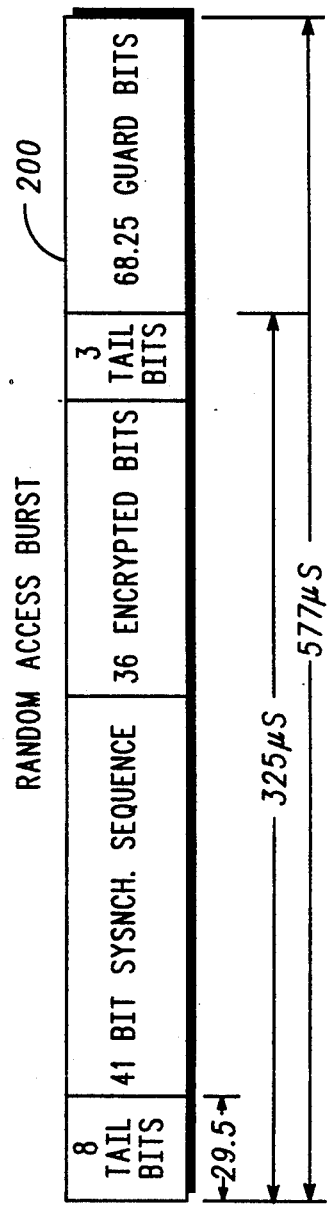

AMPLITUDE CONTROL OF A BURST SIGNAL IN A RECEIVER

This is a continuation of application Ser. No. 07/642,253, filed Jan. 16, 1991 and now abandoned.

FIELD OF THE INVENTION

The invention generally relates to Time Division Multiple-Access (TDMA) radiotelephone systems and more specifically to TDMA radiotelephone systems requiring automatic gain control to maintain a linear amplitude response in the radiotelephone receiver.

BACKGROUND OF THE INVENTION

Time Division Multiple-Access (TDMA) radiotelephone systems which require channel equalization typically impose the need for a linear receiver employing automatic gain control (AGC), conforming to stringent dynamic requirements. Frequently, an additional requirement of the AGC system is to first acquire and then hold the appropriate AGC state for the majority of the timeslot. This permits the receiver to maintain a linear amplitude response which is necessary for optimal channel equalization.

The dynamic requirements for the AGC system can be broken into two cases: the traffic channel (TCH) or the "voice channel", and the random access channel (RACH). In a TCH condition, a given timeslot within the TDMA frame is occupied by the same mobile user for consecutive frames. Neglecting the effects of long-term signal variations, the received power level for a TCH has a tolerably small amount of variation from one TDMA frame to the next. Consecutive timeslots within the frame, however, represent different mobile users, and as such, can be received at widely different levels. For a TCH timeslot, the receiver's AGC system can take advantage of previous knowledge of the appropriate AGC state. It therefore needs to re-configure to that AGC state during a guard period between timeslots.

Unlike the TCH, the RACH can be considered a one-time event. As a result, the base-station receiver does not have the benefit of advanced knowledge of the mobile's received signal level. It must therefore acquire and hold the appropriate AGC state during the actual random access burst. In addition, it must perform this function quickly so as to permit proper reception of the transmitted data and proper channel equalization.

RACH operation is further complicated by the uncertainty of the start of the random access burst with respect to the start of the random access timeslot. In the Pan-European Digital Cellular system, or better known as GSM, the RACH utilizes a shortened TDMA burst called the random access burst. This shortened burst is required to compensate for the time delay between mobile transmission and base reception which when combined with the requirement for the receiver gain to be held constant throughout the majority of the burst, results in the requirement for the AGC system to first detect the mobile's presence on channel and then institute an acquire and hold process. The time period that the receiver uses to institute the acquire and hold process needs to be minimized so that the impact on the radio sensitivity or receiver bit error rate is negligible.

Thus, a need exists for a receiver incorporating an AGC system which detects and applies the appropriate AGC value to a RACH channel in a TDMA system.

SUMMARY OF THE INVENTION

A receiver module in a time-division multiple access (TDMA) communication system controls the amplitude of a received burst signal, wherein the received burst signal is input into the receiver module during the time of one TDMA timeslot. The receiver module stores amplitude control values related to continuous signal amplitudes, detects when during the TDMA timeslot time the received burst signal arrives, responsive to the detection, monitors the amplitude of the received burst signal for at least one predetermined time period of the TDMA timeslot. The receiver module, responsive to the monitoring, selects an amplitude control value corresponding to the amplitude of the received burst signal, and responsive to the monitoring, controls the amplitude of the received burst signal after at least the one predetermined time period.

BRIEF DESCRIPTION OF THE DRAWINGS

FIG. 1 generally depicts a base-station receiving the burst signal or more specifically a random access burst signal.

FIG. 2 depicts the random access burst timeslot in accordance with the invention.

DETAILED DESCRIPTION OF THE PREFERRED EMBODIMENT

Figure 3:
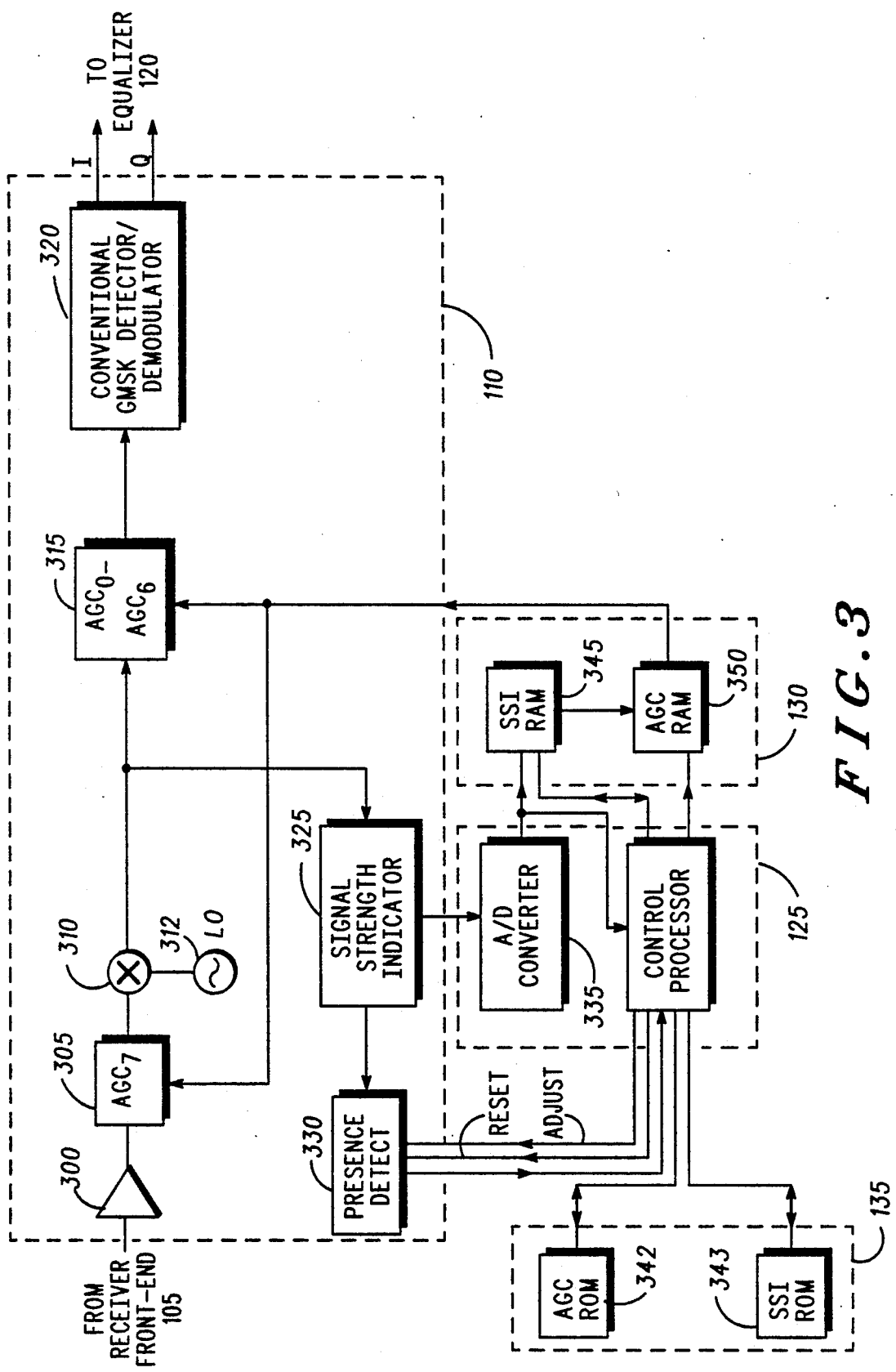
FIG. 3 generally illustrates the hardware performing AGC of the random access burst in accordance with the invention.

FIG. 1 generally depicts a base-station 115 which may employ the present invention. The random access burst which would be transmitted by a subscriber unit in a single timeslot is received by an antenna 100 which is coupled to a bulkhead connector 103 mounted at the top of the base-station 115. A receiver front-end 105 accepts the random access burst and distributes the burst to a receiver 110. The receiver has as input a random burst which is used to initiate communication and a series of traffic bursts used to maintain or sustain communication, along with various other types of bursts. Each type of burst occurs in a timeslot specifically reserved for that particular burst or transmission. The receiver 110 will detect or demodulate each burst into an in-phase and quadrature phase (I & Q) components which are input into an equalizer 120. The receiver, as is the equalizer, is coupled to a controller 125 which contains all control hardware necessary to perform the RACH AGC process. The controller has a data-out port for sending data to additional devices and a data-in port for receiving data from additional devices. A controller interface which essentially allows the controller 125 to communicate to a user is also available, and in the preferred embodiment is typically connected to a PC. The controller interface, through the controller 125, is the interface used for entering calibration factors of the base-station 115. The controller 125 is coupled to a read only memory (ROM) 135 and a random access memory (RAM) 130. The receiver 110, equalizer 120, controller 125, RAM 130, and ROM 135 generally comprise a receiver module or radio channel unit (RCU) 140. The receiver front-end 105 is used to distribute the incoming signal to at least one RCU 140, depending on the configuration of the base-station 115.

FIG. 2 illustrates the random access burst as defined in Groupe Special Mobile (GSM) Recommendation 5.01, version 3.1.0, Feb. 15, 1988. The burst is comprised of 8 tail bits which occur for 29.5 μs of the timeslot followed by a 41 bit synchronization sequence used to synchronize the burst to the corresponding channel. The 41 bit synchronization sequence is followed by 36 encrypted bits which contain information regarding the subscriber, such as the subscriber ID number, subscriber registration number, etc. The encrypted bits are followed by three tail bits which are then followed by 68.25 guard bits. The guard bits are reserved to compensate for time delays the burst 200 encounters in getting to the base-station 115. The total timeslot length is 577 μs.

FIG. 3 generally depicts components of the RCU 140 which perform AGC of the random access burst 200 in accordance with the invention. Before the RCU 140 is installed into a base-station 115, the RCU 140 receiver linearity characteristics must be determined. During this characterization or calibration, a known RF input is applied to the RCU 140. The known RF signal is amplified by a RF amplifier 300 and may either pass through an attenuator 305 or bypass the attenuator 305. The signal then enters a mixer 310 which also has as input a local oscillator (LO) 312 to mix the signal down to a first intermediate frequency (IF). The signal amplitude after mixing is input into a signal strength indicator 325 which produces a raw DC voltage proportional to the logarithm of the received signal level. The raw SSI voltage is then input into an analog-to-digital converter (A/D) 335 which converts the raw SSI voltage to a digital word which at this point has not been linearized. The non-linearized raw SSI word is monitored by the control processor 340 which in the preferred embodiment is a Motorola 68030 microprocessor. Multiple samples of the raw SSI word are taken and an average value is calculated. This value is then sent as an address to a SSI RAM 345 and the linearized SSI word for that particular RF input power level is written as data to that address. This process is repeated for the complete RF power input range, which in the preferred embodiment is −110 dBm to −10 dBm. The control processor 340 also stores all SSI information in a SSI ROM 342 so that the SSI RAM 345 may be reloaded whenever the RCU is re-initialized.

The AGC look-up table must also be calibrated. During AGC calibration, a known RF power level is applied to the RCU 140. The I and Q signals exiting the receiver 110 are monitored to determine if they are at the correct level for A/D input located at the equalizer 120. If I and Q are not at the correct level, the attenuation represented by attenuator $AGC_7$ 305 and a series of attenuators $AGC_0$–$AGC_6$ 315 is varied until the correct levels are reached. To comply with specified RF performance requirements, $AGC_7$ 305 is forced active or is input for attenuation states greater than 55 dB, and forced inactive, or bypassed, otherwise. The state of the eight attenuators is recorded and used as the AGC word for that particular RF input level. The control processor 340 then sends the linearized SSI word as an address to the AGC RAM 350 and sends the AGC word as the data for this address. The most significant bit represents $AGC_7$ 305. The lower seven bits represent the IF attenuators $AGC_6$ through $AGC_0$ 315. The same procedure is repeated for all RF input levels. As it does for SSI, the control processor 340 stores all AGC information in the AGC ROM 343 for RCU 140 reinitialization.

AGC during a traffic channel (TCH) relies on the past history of the TCH signal strength. During the guard period preceding the TCH timeslot, a processor (not shown) on the equalizer 120 writes a modified SSI word to the address lines of the AGC RAM 350. The modified SSI word is the result of an averaging algorithm which produces the estimated average value of the mobile's signal strength. All eight bits of the correct AGC state are then latched to associated attenuators, inserting the attenuators as required. The entire procedure requires less than 10 μs and is completed before the start of the timeslot. This procedure is repeated every timeslot.

Initiation of AGC acquisition during the RACH requires a determination of the mobile's presence on the appropriate channel. Due to the required immediacy of detection, only the mobile's received signal strength qualifies for this purpose. Therefore, the SSI voltage, as it compares to a specific threshold voltage, is used as the basis for presence detection. The mobile detect threshold voltage is selected via software. Access to the presence detect threshold hardware is accomplished via a three bit bus, which permits one of eight values to be selected from a predetermined range. The range is intended to allow compensation for two variables: 1) Different cell-site characteristics may result in a need for different presence detect Carrier to Noise Ratios (C/N). As an example, a small urban cell may require a higher detect threshold to avoid co-channel interference, while large rural cells may require lower detect threshold in order to detect distant, low level mobiles. 2) Different receiver front-end 105 configurations produce different receiver noise floors. Therefore, in order to detect mobile presence at a specific value of C/N, the detect threshold must be variable.

AGC during a random access channel (RACH) is accomplished as follows. Beginning in the guard period preceding the random access burst 200 timeslot, the output from the SSI RAM 345 is routed directly to the address line of the AGC RAM 350. The output of the AGC RAM controls eight attenuators, $AGC_7$ 305 and a block of attenuators $AGC_0$–$AGC_6$ 315. The output of the AGC RAM is updated every A/D converter 335 sample (approximately once per microsecond). Sometime during this process, the mobile presence detect 330 will indicate that the random access burst 200 has arrived in the timeslot. The presence detect 330 notifies the control processor 340 of the burst presence and at this point, the AGC system begins to converge on the appropriate AGC state. This iterative process is repeated until approximately 28 microseconds has passed since the mobile was determined to be present, at which point $AGC_7$ is inserted. After an additional 20 microseconds, $AGC_0$ through $AGC_6$ 315 are inserted. The 48 microsecond total acquisition time is chosen to ensure sufficient SSI response time in the case when the mobile is detectable 28 microseconds before the start of the random access burst. This scenario can occur as a result of the mobile power ramping during the guard period preceding the random access burst 200 timeslot. In all cases, the AGC system will acquire the correct AGC state before the end of the first 8 tail bits of the random access burst 200.

Figure 4:
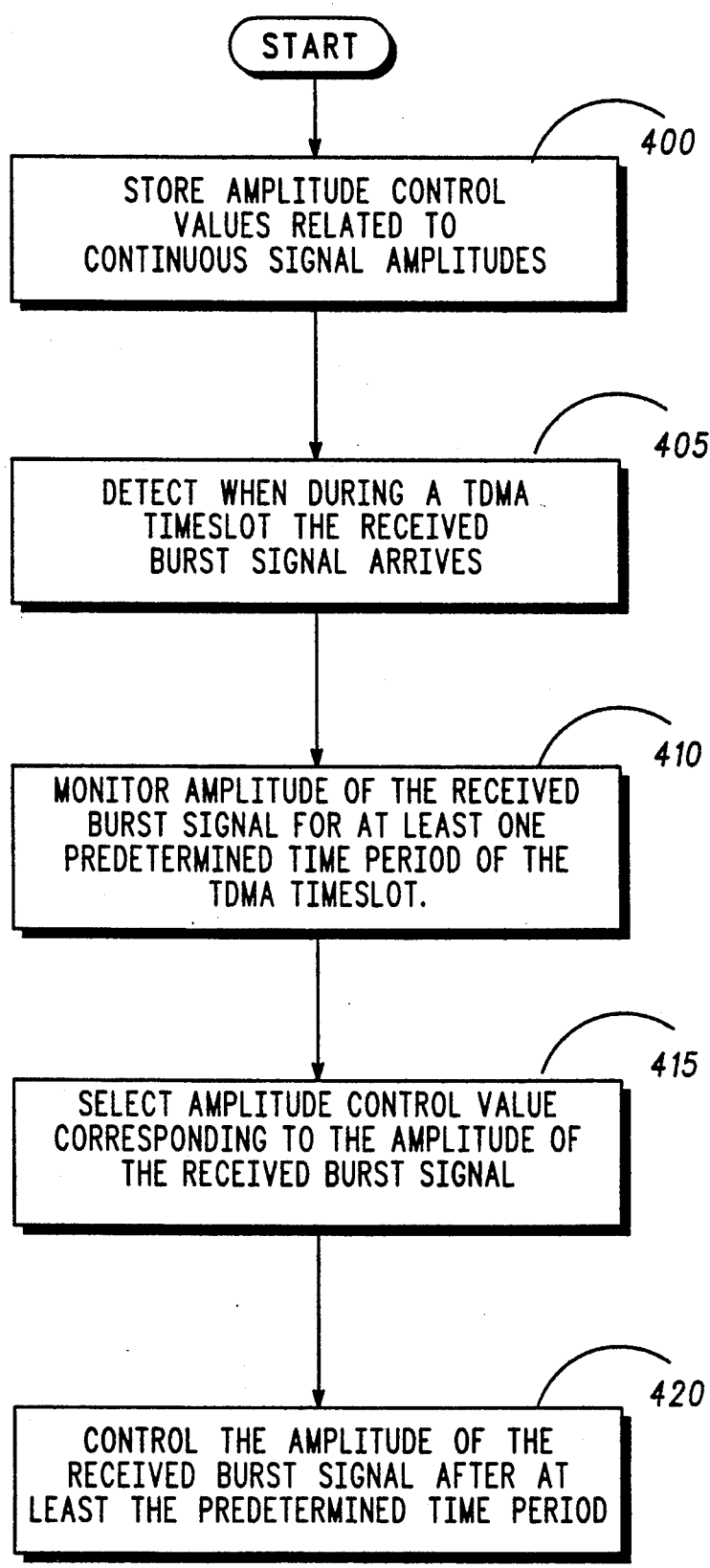
FIG. 4 generally depicts in flow diagram form the steps the receiver module or RCU performs to AGC the random access burst in accordance with the invention.

FIG. 4 depicts the steps the RCU 140 performs to AGC the random access burst 200. The RCU 140 stores at 400 amplitude control values related to continuous signal amplitudes and detects at 405 when during a TDMA timeslot the received burst signal arrives. The RCU 140 then monitors at 410 the received burst signal for at least one predetermined time period of the TDMA timeslot and selects at 415 an amplitude control value corresponding to the amplitude of the received burst signal. The RCU 140 then controls at 420 the amplitude of the received burst signal after at least the predetermined time period. With this method, the burst signal of the RACH is detected and AGC applied during the duration of a RACH timeslot.

What I claim is:

1. A receiver module in a time-division multiple access (TDMA) communication system for controlling the amplitude of a randomly received burst signal, the randomly received burst signal being input into the receiver module during the time of one TDMA timeslot, the receiver module comprising:
   means for storing amplitude control values related to continuous signal amplitudes;
   means for detecting when during the TDMA timeslot time the randomly received burst signal arrives;
   means, responsive to said means for detecting, for monitoring the amplitude of said randomly received burst signal for at least one predetermined time period of the TDMA timeslot;
   means, coupled to said means for storing and responsive to said means for monitoring, for selecting an amplitude control value corresponding to the amplitude of said randomly received burst signal; and
   means, responsive to said selected amplitude control value, for controlling the amplitude of said randomly received burst signal after at least said one predetermined time period.

2. The receiver module of claim 1 where said means for detecting further comprises means for providing a predetermined presence threshold.

3. The receiver module of claim 2 wherein said means for detecting further comprises means for determining when the amplitude of said randomly received burst signal is greater than said predetermined presence threshold.

4. The receiver module of claim 1 wherein said means for controlling further comprises means for attenuating the amplitude of said randomly received burst signal.

5. The receiver module of claim 4 wherein said means for attenuating further comprises means for providing at least one attenuation value for attenuating the amplitude of said randomly received burst signal.

6. A time-division multiple access (TDMA) base-station for controlling the amplitude of a randomly received burst signal and employing a receiver module having as an input at least one randomly received burst signal during the time of one TDMA timeslot, the TDMA base-station comprising:
   at least one antenna for accepting the randomly received burst signal during the time of one TDMA timeslot;
   means for storing amplitude control values related to continuous signal amplitudes;
   means for detecting when during the TDMA timeslot time the randomly received burst signal arrives;
   means, responsive to said means for detecting, for monitoring the amplitude of said randomly received burst signal for at least one predetermined time period of the TDMA timeslot;
   means, coupled to said means for storing and responsive to said means for monitoring, for selecting an amplitude control value corresponding to the amplitude of said randomly received burst signal; and
   means, responsive to said selected amplitude control value, for controlling the amplitude of said randomly received burst signal after at least said one predetermined time period.

7. The TDMA base-station of claim 6 where said means for detecting further comprises means for providing a predetermined presence threshold.

8. The TDMA base-station of claim 7 wherein said means for detecting further comprises means for determining when the amplitude of said randomly received burst signal is greater than said predetermined presence threshold.

9. The TDMA base-station of claim 6 wherein said means for controlling further comprises means for attenuating the amplitude of said randomly received burst signal.

10. The TDMA base-station of claim 9 wherein said means for attenuating further comprises means for providing at least one attenuation value for attenuating the amplitude of said randomly received burst signal.

11. A method of controlling the amplitude of a randomly received burst signal in a receiver module employed in a time-division multiple access (TDMA) communication system, the randomly received burst signal being input into the receiver module during the time of one TDMA timeslot; the method comprising:
   storing amplitude control values related to continuous signal amplitudes;
   detecting when during the TDMA timeslot time the randomly received burst signal arrives;
   monitoring, responsive to said step of detecting, the amplitude of said randomly received burst signal for at least one predetermined time period of the TDMA timeslot;
   selecting, responsive to said step of monitoring, an amplitude control value corresponding to the amplitude of said randomly received burst signal; and
   controlling, responsive to said selected amplitude control value, the amplitude of said randomly received burst signal after at least said one predetermined time period.

12. The method of claim 11 where said step of detecting further comprises the step of providing a predetermined presence threshold.

13. The method of claim 12 wherein said step of detecting further comprises the step of determining when the amplitude of said randomly received burst signal is greater than said predetermined presence threshold.

14. The method of claim 11 wherein said step of controlling further comprises the step of attenuating the amplitude of said received burst signal.

15. The method of claim 14 wherein said step of attenuating further comprises the step of providing at least one attenuation value for attenuating the amplitude of said randomly received burst signal.

16. A method of controlling the amplitude of a randomly received burst signal in a time-division multiple access (TDMA) base-station, the TDMA base-station employing a receiver module having as an input at least one randomly received burst signal during the time of one TDMA timeslot, the method comprising:
   at least one antenna for accepting the randomly received burst signal during the time of one TDMA timeslot;
   storing amplitude control values related to continuous signal amplitudes;

detecting when during the TDMA timeslot time the randomly received burst signal arrives;

monitoring, responsive to said step of detecting, the amplitude of said randomly received burst signal for at least one predetermined time period of the TDMA timeslot;

selecting, responsive to said step of monitoring, an amplitude control value corresponding to the amplitude of said randomly received burst signal; and controlling, responsive to said selected amplitude control value, the amplitude of said randomly received burst signal after at least said one predetermined time period.

17. The method of claim 16 where said step of detecting further comprises the step of providing a predetermined presence threshold.

18. The method of claim 17 wherein said step of detecting further comprises the step of determining when the amplitude of said randomly received burst signal is greater than said predetermined presence threshold.

19. The method of claim 16 wherein said step of controlling further comprises the step of attenuating the amplitude of said randomly received burst signal.

20. The method of claim 19 wherein said step of attenuating further comprises the step of providing at least one attenuation value for attenuating the amplitude of said randomly received burst signal.

* * * * *